United States Patent
Clade et al.

(10) Patent No.: US 9,234,677 B2
(45) Date of Patent: Jan. 12, 2016

(54) ELECTRIC HEATING DEVICE, IN PARTICULAR FOR MOTOR VEHICLES

(75) Inventors: Michael Clade, Lambshire (DE); Franz Bohlender, Kandel (DE)

(73) Assignee: Catem GmbH & Co. KG, Herxheim bei Landeau (DE)

( * ) Notice: Subject to any disclaimer, the term of this patent is extended or adjusted under 35 U.S.C. 154(b) by 1460 days.

(21) Appl. No.: 12/174,361

(22) Filed: Jul. 16, 2008

(65) Prior Publication Data

US 2009/0020515 A1   Jan. 22, 2009

(30) Foreign Application Priority Data

Jul. 20, 2007   (EP) ..................................... 07014323

(51) Int. Cl.
| | |
|---|---|
| *B60L 1/02* | (2006.01) |
| *F24H 9/18* | (2006.01) |
| *F24H 3/04* | (2006.01) |
| *F24H 9/20* | (2006.01) |
| *H05K 1/02* | (2006.01) |

(52) U.S. Cl.
CPC ............ *F24H 9/1863* (2013.01); *F24H 3/0405* (2013.01); *F24H 3/0429* (2013.01); *F24H 3/0435* (2013.01); *F24H 3/0441* (2013.01); *F24H 3/0447* (2013.01); *F24H 3/0464* (2013.01); *F24H 9/1872* (2013.01); *F24H 9/2071* (2013.01); *H05K 1/0203* (2013.01)

(58) Field of Classification Search
CPC ... F24H 9/1863; F24H 3/0405; F24H 3/0429; F24H 3/0435; F24H 3/0441; F24H 3/0447; F24H 3/0464; F24H 9/1872; F24H 9/2071; H05B 2203/013; H05B 3/02; H05B 3/84; H05B 1/00; H05K 1/0203

USPC ......... 219/202, 504, 520–523, 536, 537, 540, 219/541, 544, 548; 392/347; 277/597
See application file for complete search history.

(56) References Cited

U.S. PATENT DOCUMENTS

| | | | | | |
|---|---|---|---|---|---|
| 4,822,980 | A | * | 4/1989 | Carbone et al. | ............... 392/453 |
| 4,939,349 | A | * | 7/1990 | Liu | ............... 219/552 |
| 4,948,953 | A | * | 8/1990 | Starck | ............... 219/504 |
| 4,990,748 | A | * | 2/1991 | Starck | ............... 392/485 |
| 5,028,763 | A | * | 7/1991 | Chung-Tai | ............... 219/530 |

(Continued)

FOREIGN PATENT DOCUMENTS

EP   1 338 451 A   8/2003

OTHER PUBLICATIONS

European Search Report for European Patent Application No. EP 07 01 4323 Dated Jan. 24, 2008.

(Continued)

*Primary Examiner* — Eric Stapleton
(74) *Attorney, Agent, or Firm* — Boyle Fredrickson, S.C.

(57) ABSTRACT

An electric heating device that provides additional heating for motor vehicles includes several heating elements assembled to form a heating block, and a controller for controlling the heating elements. The controller forms a constructional unit together with the heating block. Contact and/or cooler elements extend between the controller and the heating block. The controller is held at a control means support. Between the controller support and a heating block housing accommodating the heating block, sealing elements are provided through which the contact or cooler elements project and which are sealed by clamping between the controller support and the heating block housing.

8 Claims, 3 Drawing Sheets

(56) References Cited

U.S. PATENT DOCUMENTS

| | | | | |
|---|---|---|---|---|
| 5,057,672 A * | 10/1991 | Bohlender et al. | | 219/540 |
| 5,198,640 A * | 3/1993 | Yang | | 219/530 |
| 5,239,163 A * | 8/1993 | Brouwers | | 219/202 |
| 5,256,857 A * | 10/1993 | Curhan et al. | | 219/202 |
| 5,326,418 A * | 7/1994 | Yeh | | 156/291 |
| 5,377,298 A * | 12/1994 | Yang | | 392/360 |
| 5,471,034 A * | 11/1995 | Kawate et al. | | 219/485 |
| 5,562,844 A * | 10/1996 | Bohlender et al. | | 219/540 |
| 5,593,748 A * | 1/1997 | Hubbard | | 428/41.3 |
| 5,598,502 A * | 1/1997 | Takahashi et al. | | 392/502 |
| 5,665,261 A * | 9/1997 | Damsohn et al. | | 219/504 |
| 5,729,189 A * | 3/1998 | Oya et al. | | 338/22 SD |
| 5,854,471 A * | 12/1998 | Tadokoro et al. | | 219/540 |
| 5,990,459 A * | 11/1999 | Feustel et al. | | 219/486 |
| 5,995,711 A * | 11/1999 | Fukuoka et al. | | 392/347 |
| 6,034,352 A * | 3/2000 | Gortler et al. | | 219/202 |
| 6,055,360 A * | 4/2000 | Inoue et al. | | 392/485 |
| 6,078,024 A * | 6/2000 | Inoue et al. | | 219/202 |
| 6,178,292 B1 * | 1/2001 | Fukuoka et al. | | 392/485 |
| 6,180,930 B1 * | 1/2001 | Wu | | 219/530 |
| 6,259,075 B1 * | 7/2001 | Wu | | 219/540 |
| 6,265,692 B1 * | 7/2001 | Umebayahi et al. | | 219/202 |
| 6,392,207 B2 * | 5/2002 | Beetz et al. | | 219/530 |
| 6,720,536 B2 * | 4/2004 | Bohlender | | 219/504 |
| 6,723,966 B2 * | 4/2004 | Jiang | | 219/505 |
| 6,729,388 B2 * | 5/2004 | Emrich et al. | | 165/153 |
| 6,810,203 B2 * | 10/2004 | Alban et al. | | 392/347 |
| 6,832,648 B2 * | 12/2004 | Torigoe et al. | | 165/148 |
| 6,847,017 B2 * | 1/2005 | Starck et al. | | 219/534 |
| 6,875,962 B2 * | 4/2005 | Uhl et al. | | 219/530 |
| 6,903,312 B2 * | 6/2005 | Miura et al. | | 219/506 |
| 6,919,535 B2 * | 7/2005 | Uhl et al. | | 219/202 |
| 6,921,502 B1 * | 7/2005 | Nord et al. | | 264/46.4 |
| 6,940,050 B2 * | 9/2005 | Probst | | 219/486 |
| 6,957,013 B2 * | 10/2005 | Zimmer | | 392/397 |
| 7,012,225 B2 * | 3/2006 | Bohlender et al. | | 219/536 |
| 7,026,584 B2 * | 4/2006 | Bohlender | | 219/548 |
| 7,064,301 B2 * | 6/2006 | Han et al. | | 219/540 |
| 7,098,429 B2 * | 8/2006 | Angermann et al. | | 219/530 |
| 7,200,327 B2 * | 4/2007 | Pierron et al. | | 392/350 |
| 7,297,901 B2 * | 11/2007 | Lee | | 219/202 |
| 7,667,165 B2 * | 2/2010 | Bohlender et al. | | 219/536 |
| 7,667,166 B2 * | 2/2010 | Zeyen et al. | | 219/552 |
| 2001/0013512 A1 * | 8/2001 | Eisenhardt et al. | | 219/202 |
| 2001/0050843 A1 * | 12/2001 | Ueno et al. | | 361/704 |
| 2002/0011484 A1 * | 1/2002 | Beetz et al. | | 219/530 |
| 2003/0180033 A1 * | 9/2003 | Alban et al. | | 392/347 |
| 2003/0206730 A1 * | 11/2003 | Golan | | 392/399 |
| 2004/0112884 A1 * | 6/2004 | Uhl et al. | | 219/202 |
| 2005/0047768 A1 * | 3/2005 | Kuebler et al. | | 392/493 |
| 2005/0056637 A1 * | 3/2005 | Bohlender et al. | | 219/536 |
| 2005/0072774 A1 * | 4/2005 | Bohlender | | 219/548 |
| 2005/0133490 A1 * | 6/2005 | Brun et al. | | 219/202 |
| 2005/0175328 A1 * | 8/2005 | Pierron et al. | | 392/347 |
| 2005/0205552 A1 * | 9/2005 | Han et al. | | 219/540 |
| 2005/0230377 A1 * | 10/2005 | Bohlender et al. | | 219/505 |
| 2007/0068913 A1 * | 3/2007 | Zeyen et al. | | 219/201 |
| 2007/0095809 A1 * | 5/2007 | Lee | | 219/222 |
| 2007/0114217 A1 * | 5/2007 | Bohlender et al. | | 219/202 |
| 2007/0138159 A1 * | 6/2007 | Pierron et al. | | 219/202 |
| 2007/0187384 A1 * | 8/2007 | Colette et al. | | 219/216 |
| 2008/0061159 A1 * | 3/2008 | Okano et al. | | 237/12.3 A |
| 2008/0073336 A1 * | 3/2008 | Bohlender et al. | | 219/467.1 |

OTHER PUBLICATIONS

Japanese Utility Model Application No. 1991-070678 (Japanese Utility Model Application No. 1993-016413).

* cited by examiner

ELECTRIC HEATING DEVICE, IN PARTICULAR FOR MOTOR VEHICLES

BACKGROUND OF THE INVENTION

1. Field of the Invention

The invention relates to an electric heating device for heating air which is in particular suited to be employed as additional electric heating in motor vehicles.

2. Description of the Related Art

For the employment in motor vehicles, in particular those with engines of which the consumption is optimized, electric heating devices are used to heat the passenger compartment andor the engine. An additional electric heating is in particular required after the starting of the engine as long as the internal combustion engine does not yet provide sufficient thermal energy. Internal combustion engines of which the consumption is optimized even principally require the use of an additional electric heating.

However, the use of such heating devices is not restricted to the field of motor vehicles; they are also suited for a plurality of other applications, for example in the field of domestic installations (room air conditioning), industrial plants and the like.

An electric heating device for motor vehicles is known from EP-A1-1 395 098. The described heating device comprises several heating elements assembled to a heating block. The heating block is held in a common frame together with a control means for controlling the heating elements. The control means thus forms a constructional unit together with the heating block held in the frame. The control means comprises power electronics with electronic switches which are provided each with a heat sink. The control means is arranged such that a portion of the air flow to be heated flows against the control means, in particular the cooler elements for cooling the electronic switches.

The electronic switches, in particular in the form of power transistors which control the current that is supplied to the heating elements, are mounted directly on a printed circuit board with one side. To dissipate the thermal loss generated by the power transistors, a cooler element is provided on the opposite side of the printed circuit board. Such a cooler element which directly contacts the power transistor can dissipate the thermal loss of the power transistor in a simple manner and in a sufficient amount.

In the above-mentioned prior art, a U-shaped heat sink with cooling fins or fingers, respectively, which project from a base, is employed. A pin is provided at the bottom side of the heat sink and can be inserted in the printed circuit board to contact the power transistor. However, a cooler element in the sense of the present invention can be any component which is suited to dissipate heat from the power transistors by heat conduction and emit it effectively to the air flowing around it by heat transfer. To this end, the cooler element is exposed to the air which is to be heated by the electric heating device, i.e. which flows in a channel leading to the electric heating device. However, it cannot be excluded that moisture collects in the channel which is either directly introduced with the inflowing air or is condensed from the air that has flowed in.

OBJECT OF THE INVENTION

It is therefore the object of the present invention to further develop an electric heating device of the type mentioned in the beginning, so that the same can be easily manufactured and the control means of the electric heating device can be reliably protected from penetrating moisture.

To achieve this object, an electric heating device having the features of claim 1 is provided with the present invention. It differs from the generic prior art in that the control means is held at a control means support and that between the control means support and a heating block housing accommodating the heating block sealing elements are provided through which the contact or cooler elements project and which are sealed by clamping between the control means support and the heating block housing.

In the electric heating device according to the invention, the constructional unit is provided in that the control means support is connected to the heating block housing. The contact elements which take care of the supply of the heating block with electric current as well as the cooler elements effecting the cooling of the electronic switches extend between the control means support and the heating block housing. The contact or cooler elements, respectively, project through at least one sealing element. The tightness of the sealing element is provided in that the sealing element is clamped between the control means support and the heating block housing. This permits to first mount the sealing elements without stresses and to clamp the respective sealing elements to achieve a sealing contact not before the constructional unit of the control means and the heating block is created, i.e. when the control means support is connected to the heating block housing. The electric heating device according to the invention can thereby be manufactured in a simple manner without having to dispense with a reliable sealing of the control means.

The electric heating device according to the invention can be particularly simply and therefore economically manufactured if the cooler element or elements, respectively, isare embodied as pin or plate-shaped solid bodies which are lead through the printed circuit board for their connection to the electronic switch (e.g. power transistor) and which project over the printed circuit board at the bottom side facing away from the electronic switch. In the contact area with the sealing element, at the cooler element or elements as well as at the contact elementor contact elements, sealing or contact surfaces for the sealing elements can be provided which differ from a cylindrical and thus the simple shape. Such embodiments are in particular preferred with respect to a radial clamping of the sealing elements against the inside circumference of the contact or cooler elements, respectively. Alternatively, the control means support andor the heating block housing can comprise conical mountings for the sealing elements which surround the passages for the contact or cooler elements, respectively. To generate a sealing contact of the sealing elements at the inside circumference of the passages on the one hand and the outside circumference of the contact elements or the cooler elements on the other hand, the sealing elements are fixed between the heating block housing and the control means support preferably axially, i.e. in the longitudinal direction of the cooler or contact elements, respectively. When the constructional unit consisting of the heating block housing and the control means support is being completed, the sealing elements through which the contact or cooler elements, respectively, project are compressed in the longitudinal direction of these elements leading to a sealing contact in the radial direction.

In electric heating devices of the type mentioned above, several electronic switches can be provided. Moreover, usually more than two contact elements for supplying the individual heating elements are provided, which practically project over the heating block housing at the frontal side at which the control means support is located. With respect to an assembly of the electric heating device as simple as possible, it is suggested according to a further preferred embodiment of the present invention to connect the sealing elements with each other to form an integral sealing unit. This integral sealing unit can be, for example, pre-fixed during the assembly in that the sealing unit is shifted onto the contact elements projecting over the heating block housing. In this manner, the sealing elements for the cooler elements at the heating block housing are also brought to a predetermined position corresponding to the position of the cooler elements if the control means support is connected to the heating block housing. The sealing unit can be manufactured as injection-molded part from a heat resisting thermoplastic elastomer. Such an injection-molded part can also be inserted, for example, as an insert into an injection mold which is used to manufacture the control means support or the heating block housing or a housing half of the same. In this manner, the joining steps for the manufacture of the heating device can be reduced.

If the sealing unit is, however, embodied as an insert which is separately mounted, it is preferred to connect the sealing elements with each other by a base section. To increase tightness, it can be preferred to clamp this base section at the edge of the passages between the heating block housing and the control means support in a sealing manner. Thereby, in addition to a possibly existing radial sealing effected by the sealing elements themselves, a sealing acting at right angles to the same is created. To generate clamping forces as high as possible, it is furthermore preferred to provide a projecting collar surrounding the mountings for the sealing elements on the side of the housing. With respect to an embodiment of the heating block housing as simple as possible, it is preferred here to provide this projecting collar at the control means support which should, for the same reason, also comprise the conical mountings for the sealing elements.

To improve sealing, it is suggested according to a further preferred embodiment of the present invention to embody the sealing element to each of the contact or cooler elements, respectively, with several sealing contact surfaces arranged on after the other in the longitudinal direction with respect to these contact or cooler elements. These are preferably arranged conically stepped with respect to each other and are preferably predetermined by sealing beads arranged one after the other. In the latter preferred embodiment, the sealing beads are situated spaced apart in the longitudinal direction of the contact or cooler elements, respectively, wherein the material of the sealing elements connecting the respective sealing beads with each other preferably forms a find of film hinge which permits a certain movability of the individual sealing beads with respect to each other in the longitudinal direction of the contact or cooler elements, respectively. This promotes the sealing contact of the individual sealing contact surfaces at the contact or cooler elements and the passages or the conical mountings, respectively.

To precisely fix the sealing elements or the sealing unit during the assembly of the electric heating device, it is suggested according to a further preferred embodiment of the present invention to provide a cross web at the heating block housing which covers window openings formed at the heating block housing, the cross web forming a contact surface for the base section of the sealing element and thereby first improving the sealing. To this end, the cross web practically forms an essentially plane contact surface for the base section. However, the cross web further comprises centering mountings according to a further preferred embodiment of the present invention, in which centering projections formed at the base section are received. These centering projections are preferably located at the bottom side of the base section facing away from the sealing elements. This bottom side is placed on the plane contact surface, whereby, due to the centering mountings, an accurate positioning of the sealing unit is effected which also favors the insertion of the contact or cooler elements during the further assembly of the electric heating device. To this end, the centering mountings preferably surround the passages for the cooler andor the contact element (s).

The constructional unit between the control means and the heating block is preferably prepared in that the heating block housing is connected to a control means housing which comprises the control means support. The control means housing has a housing lid which comprises at least one interface for the supply and control of the heating device. The control means housing furthermore surrounds a printed circuit board with cooler elements essentially projecting at right angles therefrom and electronic switches. The control means housing is to effect in particular a certain mechanical protection of the control means. It is not absolutely necessary for this control means housing to seal the control means against liquids. The control means housing is in particular used for the electric connection of the electric heating device as well as possibly the fixing of the control means or the complete heating device.

To easily manufacture the constructional unit, it is however preferred to press the parts accommodated in the control means housing and electrically connected with each other onto each other in the longitudinal direction of the contact or cooler elements. To this end, the housing lid preferably comprises a contact bar which is electrically connected to at least one of the interfaces as well as to the printed circuit board and is placed onto the printed circuit board, which means that the contact bar extends essentially at right angles to the plane of the printed circuit board. The printed circuit board furthermore comprises flexible tongues cooperating with the contact elements. These flexible tongues are electrically connected to strip conductors of the printed circuit board, the flexible tongues being dimensioned such that the contact elements lying against the flexible tongues are securely electrically connected to the printed circuit board. This connection is usually effected when the contact elements are introduced into the passages recessed at the control means support. The cooler elements firmly mounted to the printed circuit board here project through passages which are recessed at the heating block housing, preferably at the cross web. At the end of this introduction movement, the sealing elements are clamped between the control means support and the heating block housing.

The thus prepared constructional unit is preferably secured in that the control means support or the control means housing, respectively, is locked with the heating block housing.

Further advantageous embodiments of the present invention are given in the subclaims.

The present invention will be described below with reference to an embodiment in connection with the drawing. In the drawing:

DETAILED DESCRIPTION OF THE PREFERRED EMBODIMENT

Figure 1:
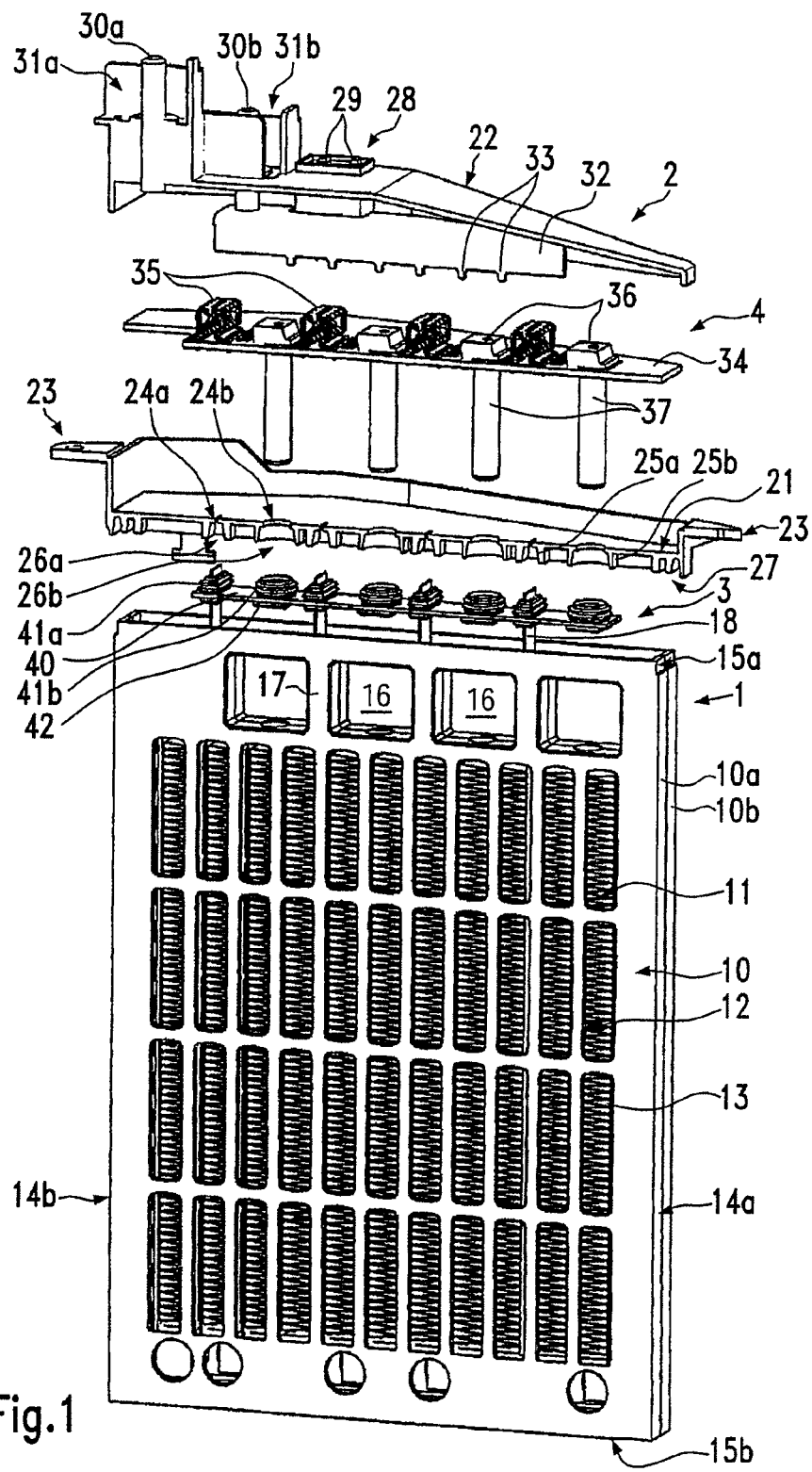
FIG. 1 shows a perspective exploded view of an embodiment of an electric heating device according to the invention.

In FIG. 1, a perspective exploded drawing is shown essentially in form of a side view of an embodiment of the electric heating device according to the invention. As essential elements, it comprises a heating block housing 1 as well as a control means housing 2. A sealing unit 3 is provided between the two housings 1, 2. The control means housing 2 surrounds a control means 4.

The heating block housing 1 consists of two essentially identical frame halves 10a, 10b which are embodied in the present case as injection-molded plastic parts and at the surface of which a stiffening grid structure is embodied. A heating block 11 consisting of a plurality of layered or stacked heating elements 12 is arranged between the grid structures of the two frame halves 10a, 10b. Each of the heating elements 12 consists of one or several resistance heating elements, which in the representation according to FIG. 1 are covered behind the longitudinal struts of the stiffening grid, and of radiators 13 arranged adjacent thereto which are in the present case formed by sheet metal strips folded in a meandering manner. In view of a good heat transfer and contact of the radiators 13 at the resistance heating elements which are preferably formed by so-called PTC elements, a plane sheet metal strip is disposed between the PTC elements and the radiator 13 of a heating element 12.

The heating block 11 of the heating elements 12 is held in the frame 10 formed by the two frame halves 10a, 10b. To this end, the frame 10 comprises oblong longitudinal spars 14a, 14b and lateral spars 15a, 15b extending at right angles thereto.

Between the upper lateral spar 15a in FIG. 1 and the heating block 11, window openings 16 are recessed in the shown embodiment. The longitudinal webs 17 separating adjacent window openings 16 surround a free end of the sheet metal strips arranged between the radiators 13 and the resistance heating elements which are continued outwards to form a contact stud 18. The contact studs 18 project over the upper edge of the frame 10 in FIG. 1.

The control means housing 2 has an essentially two-piece design with a lower housing part 21 comprising a control means support 20 and a housing lid 22 placed upon it. The lower housing part 21 has an essentially trough-like design and comprises mounting flanges 23 at its respective frontal sides for assembling the electric heating device at the chassis of a motor vehicle. The bottom of the lower housing part 21 forms the control means support 20 of which the surface that points to the inner side of the control means housing 2 is completely plane. The control means support 20 has several slotted first passages 24a which are arranged so as to alternate with round passages 24b in the longitudinal direction of the control means support 20 one after the other.

The first passages 24a with rectangular cross-sections are formed in the longitudinal and transverse directions of the control means support 20 towards the control means housing 2 in a tapering manner. The second passages 24b with a round cross-sectional area are formed so as to taper in the same direction. At the bottom side of the control means support 20 facing away from the interior of the control means housing, first and second collars 25a, 25b are located, the cross-sectional shape of which corresponds to the shape of the passages 24. These collars 25a, 25b form the major portion of internal side walls of tapered mountings 26a, 26b. The control means support 20 is bordered by a double groove 27 opened to the bottom side which is embodied such that the edge of the heating block housing 1 on the frontal side fits inside the double grooves 27.

The housing lid 22 forms a plug mounting 28 in which electric control contacts 29 are received. The housing lid 22 furthermore comprises two electric supply interfaces 30a, 30b which are shielded from each other by upright walls forming supply plug mountings 31a, 31b. The electric supply interface 30b is electrically connected to a contact bar 32 which is formed by an electrically conductive sheet metal which comprises several contacts 33 at its frontal side facing the control means support 20. Analogously, the control contacts 32 are electrically connected to each other with another control contact bar provided so as to be covered behind the contact bar 32, which control contact bar also embodies contact pins at its frontal side.

The control means 4 is disposed between the lower housing part 21 and the housing lid 22 and comprises a printed circuit board 34 on the upper side of which four double-acting flexible tongues 35 and four power transistors 36 are arranged in contact with each other in an alternating manner in the longitudinal direction. The power transistors 36 are connected to cylindrical cooler elements 37 which are lead through openings recessed in the printed circuit board 34 and project over the bottom side of the printed circuit board 34. The cylindrical cooler elements 37 are aligned with the second passages 24b and the mountings 26b embodied corresponding thereto.

Figure 3:
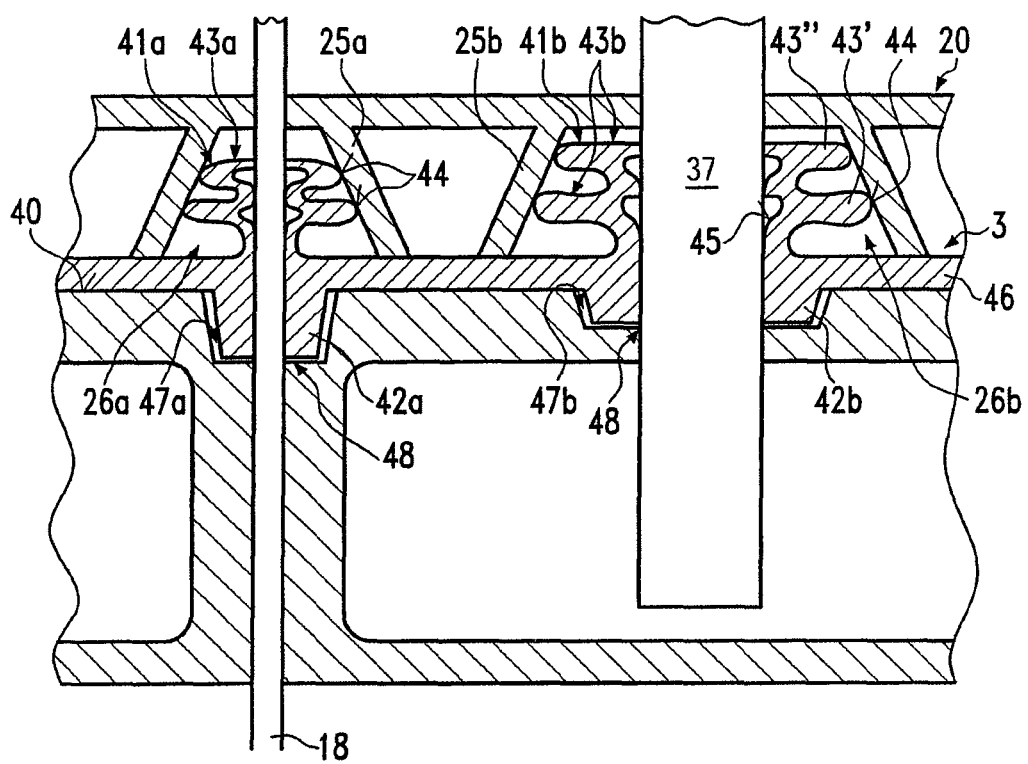
FIG. 3 shows an enlarged detail of the longitudinal section shown in FIG. 2 at the phase interface between the heating block housing and the control means housing.

The sealing unit 3 is formed of a heat resisting elastic material as a one-piece component, for example by means of injection molding or casting, and it comprises a band-shaped base section 40. First and second sealing elements 41a, 41b project over the upper side of this base section, which points to the control means housing 2. Corresponding to this, the bottom side of the base section 40 comprises centering mountings 47a, 47b) cooperating with centering projections 42a, 42b of the sealing unit 3. Each of the sealing elements 41 consists of two first and second sealing beads 43a, 43b arranged one after the other in the longitudinal direction of the cooler elements 37 or the contact studs 18. The first sealing beads 43a comprise a rectangular base with a recess embodied corresponding thereto, the second sealing beads 43b comprise a correspondingly embodied circular basic shape. The lower sealing bead 43' arranged adjacent to the base section 40 has larger dimensions than the sealing bead 43" located thereabove. Each of the sealing beads 43 forms circumferential sealing contact surfaces 44 at its outer circumferential surface which lead, due to the stepped arrangement of the sealing beads 43a, 43b, to a conical embodiment of the outer sealing surface formed by the respective sealing element 41a, 41b (cf. FIG. 3). The inside circumference of the respective sealing beads 43a, 43b is essentially constant, so that the internal sealing contact surface 45 formed by the) beads 43a, 43b has a cylindrical extension.

To assemble the embodiment shown in the FIGS, for example the heating block housing 1 as well as the control means housing 2 are first completely prepared with the heating and control elements accommodated therein. To join the three essential elements, heating block housing 1, control means housing 2 and sealing unit 3, the sealing unit 3 is, for example, pre-assembled on the side of the heating block. To this end, the first sealing elements 41a are shifted onto the contact studs 18 until the base section 40 rests on a cross web 46 represented in FIG. 3 which covers the window openings 16 on the upper side and recesses centering mountings 47a, 47b for the centering projections 42 as well as passages 48 for the cooler elements 37 leading to the window openings 16. Then, the preassembled control means housing 2 is connected to the heating block housing 1 to form a constructional unit. The cooler elements 37 are to this end inserted into the associated sealing elements 41b so as to be aligned with them until the upper edge of the heating block housing 1 is received in the internal double groove 27. During this movement, the respective sealing elements 41a, 41b each enter the respective associated mountings 26a, 26b, are centered due to the conical embodiment and finally compressed in the radial direction as the base section 40 fixes the sealing unit 3 by the contact with the cross web 46. At the same time, the free ends of the contact studs 18 are shifted through the passages 24a into the interior of the control means housing 2 and between the double-acting flexible tongues 35, whereby an electric contact between the flexible tongues 35 and the contact studs 18 is created.

At the end of the introduction movement, a radial pressure increasing with the introduction movement has built up and acts on the sealing elements 41a, 41b, which are now in sealing contact with the inside circumference of the mounting 26 on the one hand and with the outside circumference of the contact studs 18 or the cooler elements 37, respectively. In the shown embodiment, there further is a particularity in that the height of the collars 25a, 25b is selected such that the collars 25a, 25b are placed against the base section 40 on the frontal side, which is thus clamped in the longitudinal direction of the cooler elements 37 or the contact studs 18 between the cross web 46 and the frontal sides of the collars 25 in a sealing manner.

In the constructional unit prepared in this manner, the control contacts 29 are in contact with the printed circuit board 34 by means of the control contact bar, the corresponding strip conductors of which are connected to the power transistors 36. The contact pins 33 contact contact points provided at the printed circuit board 34 which lead to the power transistors 36 and can be applied to the flexible tongues 35 and thus to the contact studs 18 depending on the switching characteristic of the power transistors 36. The electric supply interface 30a for ground is electrically connected to the heating block housing 1 by means of electric strip conductors formed at the control means housing in the area of the double groove 27. The cooler elements 37 are located with their front end in the respective window openings 16.

The connection between the heating block housing 1 and the control means housing 2 can be secured in various manners, in particular by welding or gluing. The embodiment shown in the Figures is in particular suited for an inexpensive manufacture of the electric heating device as the lower housing part 21 as well as the housing lid 22 of the control means housing 2, as well as the two housing halves 10a, 10b can be manufactured by means of injection molding. The sealing unit 3 is connected to the housings 1, 2 during the assembly as insert manufactured separately from this housing.

Figure 2:
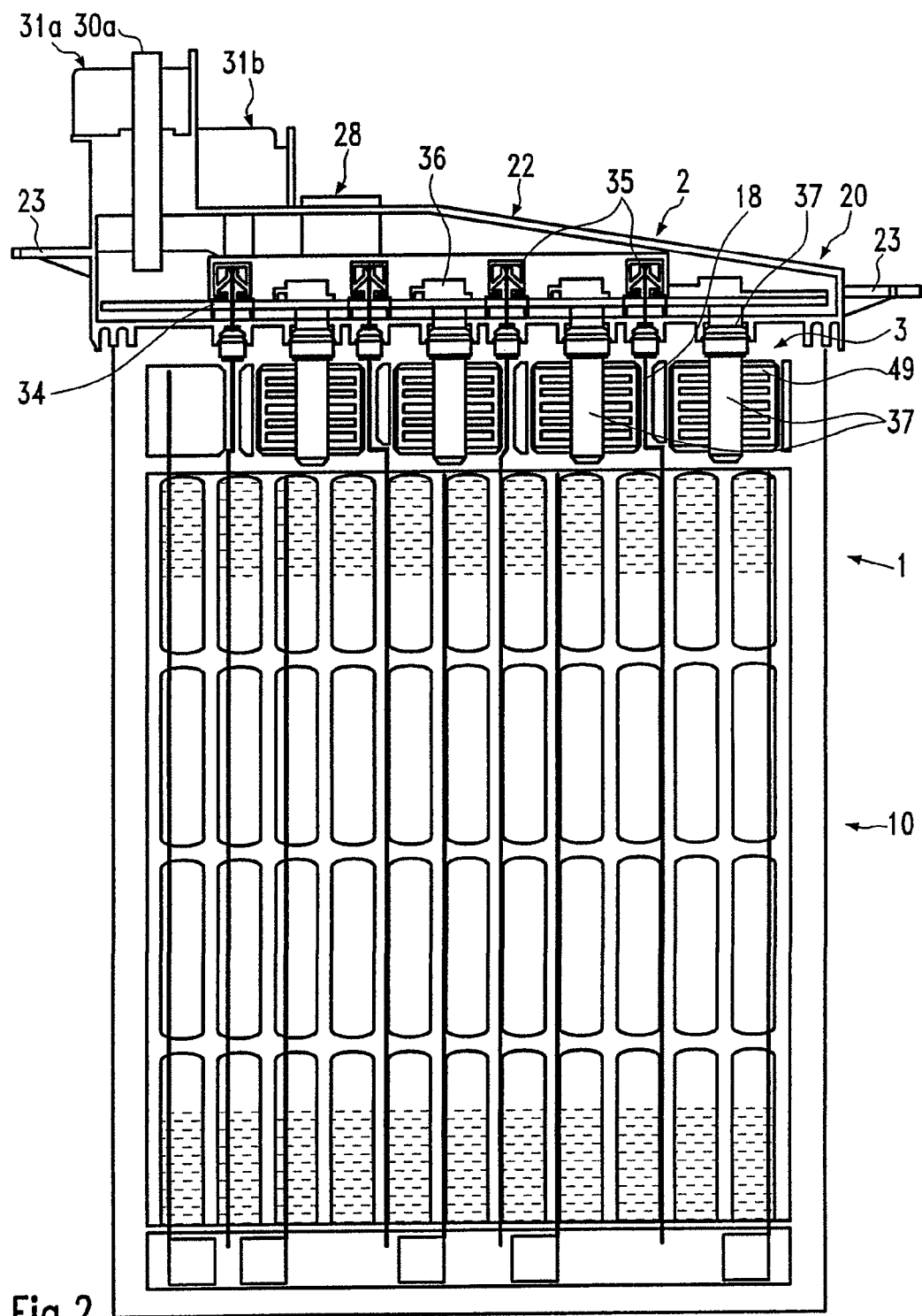
FIG. 2 shows a longitudinal section of an embodiment modified compared to FIG. 1 in an assembled condition.

The embodiment shown in FIG. 2 only differs from the one shown in FIG. 1 in that slotted heat conducting plates 49 are provided in the window openings 16 which are clipped to the front end of the cooler elements.

The invention claimed is:

1. An electric heating device for providing additional heating for motor vehicles comprising:
   a plurality of heating elements assembled to form a heating block;
   a heating block housing accommodating the heating block;
   control means for controlling the heating elements, the control means including a printed circuit board, wherein the control means and the heating block together form a constructional unit;
   a control means support that holds the control means;
   at least one of contact elements and cooler elements extending between the control means and the heating block;
   a control means housing accommodating the control means support; and
   a plurality of sealing elements provided between the control means housing and the heating block housing, wherein
      the at least one of the contact elements and the cooler elements project through the sealing elements, wherein
      the sealing elements are sealed against the control means support and the heating block housing by being clamped between the control means support and the heating block housing, and wherein
      the sealing elements are connected to each other and have a one-piece construction to form an integral seating unit.

2. The electric heating device according to claim 1, wherein the sealing elements are injection molded as a single unit forming the integral sealing unit.

3. The electric heating device according to claim 1, wherein the sealing elements abut and are radially clamped against circumferential surfaces of the contact elements andor the cooler elements.

4. An electric heating device for providing additional heating for motor vehicles comprising:
   a plurality of heating elements assembled to form a heating block:
   a heating block housing accommodating the heating block;
   control means for controlling the heating elements, the control means including a printed circuit hoard, wherein the control means and the heating block together form a constructional unit;
   a control means support that holds the control means;
   at least one of contact elements and cooler elements extending between the control means and the heating block;
   a control means housing accommodating the control means support; and
   a plurality of sealing elements provided between the control means housing and the heating block housing, wherein
      the at least one of the contact elements and the cooler elements project through the sealing elements, wherein
      the sealing elements are sealed against the control means support and the heating block housing by being clamped between the control means support and the heating block housing, and wherein
      the sealing elements abut radially circumferential surfaces of the contact elements and the cooler elements.

5. The electric heating device according to claim 1, wherein the sealing unit is fanned of a heat resisting elastic material.

6. An electric heating device for providing additional heating for motor vehicles comprising:
   a plurality of heating elements assembled to form a heating block;
   a heating block housing accommodating the heating block;
   control means for controlling the heating elements, the control means including a printed circuit board, wherein the control means and the heating block together form a constructional unit;
   a control means support that holds the control means;

at least one of contact elements and cooler elements extending between the control means and the heating block;

a control means housing accommodating the control means support; and a sealing element located between the control means housing and the heating housing, wherein the at least one of the contact elements and the cooler elements project through the sealing elements, wherein the sealing elements are sealed against the control means support and the heating block housing by being clamped between the control means support and the heating block housing, wherein the sealing elements abut radially circumferential surfaces of the contact elements and the cooler elements, and wherein the sealing unit is formed of a heat resisting elastic material.

7. The electric heating device according to claim 1, wherein the control means housing further comprises:

a lower housing part for accommodating the control means support: and a housing lid placed upon the lower housing part.

8. The electric heating device according to claim 7, wherein the housing lid includes an electric supply interface.

* * * * *